United States Patent
Chen et al.

(10) Patent No.: US 7,825,690 B2
(45) Date of Patent: Nov. 2, 2010

(54) DECOUPLE CAPACITOR FORMING CIRCUIT, INTEGRATED CIRCUIT UTILIZING THE DECOUPLE CAPACITOR FORMING CIRCUIT AND RELATED METHOD

(75) Inventors: Yi-Lin Chen, Taipei (TW); Chih-Hao Chen, Miaoli County (TW)

(73) Assignee: Realtek Semiconductor Corp., Hsinchu (TW)

(*) Notice: Subject to any disclaimer, the term of this patent is extended or adjusted under 35 U.S.C. 154(b) by 18 days.

(21) Appl. No.: 12/409,488

(22) Filed: Mar. 24, 2009

(65) Prior Publication Data

US 2010/0046139 A1 Feb. 25, 2010

(30) Foreign Application Priority Data

Mar. 25, 2008 (TW) ............................... 97110573 A

(51) Int. Cl.
*H03K 19/094* (2006.01)
(52) U.S. Cl. .......................................... 326/82; 716/14
(58) Field of Classification Search .................. 326/82, 326/83; 716/14, 19; 327/551; 257/665
See application file for complete search history.

(56) References Cited

U.S. PATENT DOCUMENTS

2007/0170553 A1* 7/2007 Correale et al. ............. 257/665

* cited by examiner

*Primary Examiner*—Daniel D Chang
(74) *Attorney, Agent, or Firm*—Thomas, Kayden, Horstemeyer & Risley, LLP

(57) ABSTRACT

A method for forming a decouple capacitor of an integrated circuit, the integrated circuit including a core circuit and a plurality of I/O circuits coupled to the core circuit, includes cutting part of a plurality of lines in at least one specific circuit of the I/O circuits to form decouple capacitors of the integrated circuit.

12 Claims, 2 Drawing Sheets

DECOUPLE CAPACITOR FORMING CIRCUIT, INTEGRATED CIRCUIT UTILIZING THE DECOUPLE CAPACITOR FORMING CIRCUIT AND RELATED METHOD

BACKGROUND OF THE INVENTION

1. Field of the Invention

The present invention relates to a decouple capacitor forming circuit, an integrated circuit utilizing the decouple capacitor forming circuit and a related method, and particularly relates to a decouple capacitor forming circuit, which has lines that are cut to form decouple capacitors, an integrated circuit utilizing the decouple capacitor forming circuit and a related method.

2. Description of the Prior Art

Conventionally, an IC (integrated circuit) includes a core circuit connected to a pad via an I/O circuit. Also, the pad is bonded to other circuits.

However, not all lines in the IC are bonding, thus circuit source is wasted if non-bonding I/O circuits for pads are not used.

SUMMARY OF THE INVENTION

Therefore, one objective of the present invention is to provide an integrated circuit, which utilizes unused I/O circuits to form a decoupled capacitor for decreasing signal noise in the integrated circuit.

One embodiment of the present invention discloses an integrated circuit, comprising: a core circuit and a plurality of I/O circuits coupled to the core circuit. Part of the lines in at least one specific I/O circuit of the I/O circuits are cut to form decouple capacitors of the integrated circuit.

Another embodiment of the present invention discloses a decouple capacitor forming circuit, comprising at least one circuit module including: a first PMOS transistor, having a drain terminal coupled to a first predetermined voltage; a first NMOS transistor, having a drain terminal coupled to the first predetermined voltage; a second PMOS transistor, having a source terminal coupled to a second predetermined voltage, a drain terminal coupled to the second predetermined voltage and the pad, and a gate terminal coupled to the first predetermined voltage, the drain terminal of the first PMOS transistor and the drain terminal of the first NMOS transistor; a third PMOS transistor, having a drain terminal coupled to the second predetermined voltage; a second NMOS transistor, having a drain terminal coupled to the second predetermined voltage; and a third NMOS transistor, having a drain terminal coupled to the second predetermined voltage and the pad; wherein the gate terminal of the second PMOS transistor is not coupled to the first PMOS transistor and the first NMOS transistor, such that the drain terminal of the second PMOS transistor is not coupled to the pad and a gate terminal of the third NMOS transistor is not coupled to the third PMOS transistor and the second NMOS transistor, thereby the decouple capacitor is formed.

Another embodiment of the present invention discloses a decouple capacitor forming circuit, comprising at least one circuit module including: a MOS transistor, having a drain terminal coupled to a first predetermined voltage, a second predetermined voltage and a gate terminal of the MOS transistor, wherein the gate terminal of the MOS transistor is also coupled to the first predetermined voltage and the second predetermined voltage, where a source terminal of the MOS transistor is coupled to the second predetermined voltage and the gate terminal; wherein lines of the I/O circuit are cut, such that the drain terminal of the MOS transistor is not coupled to the first predetermined voltage and the gate terminal of the MOS transistor, and the gate terminal of the MOS transistor is not coupled to the second predetermined voltage.

Another embodiment of the present invention discloses a method for forming a decouple capacitor in an integrated circuit including a core circuit and a plurality of I/O circuits coupled to the core circuit. The method comprises: selecting at least one specific I/O circuit from the I/O circuits; and cutting part of the lines of the specific I/O circuit to form decouple capacitors of the integrated circuit.

Via the above-mentioned embodiments, an unused I/O circuit can be utilized to form a decouple capacitor of the integrated circuit for thereby decreasing signal noise in the integrated circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
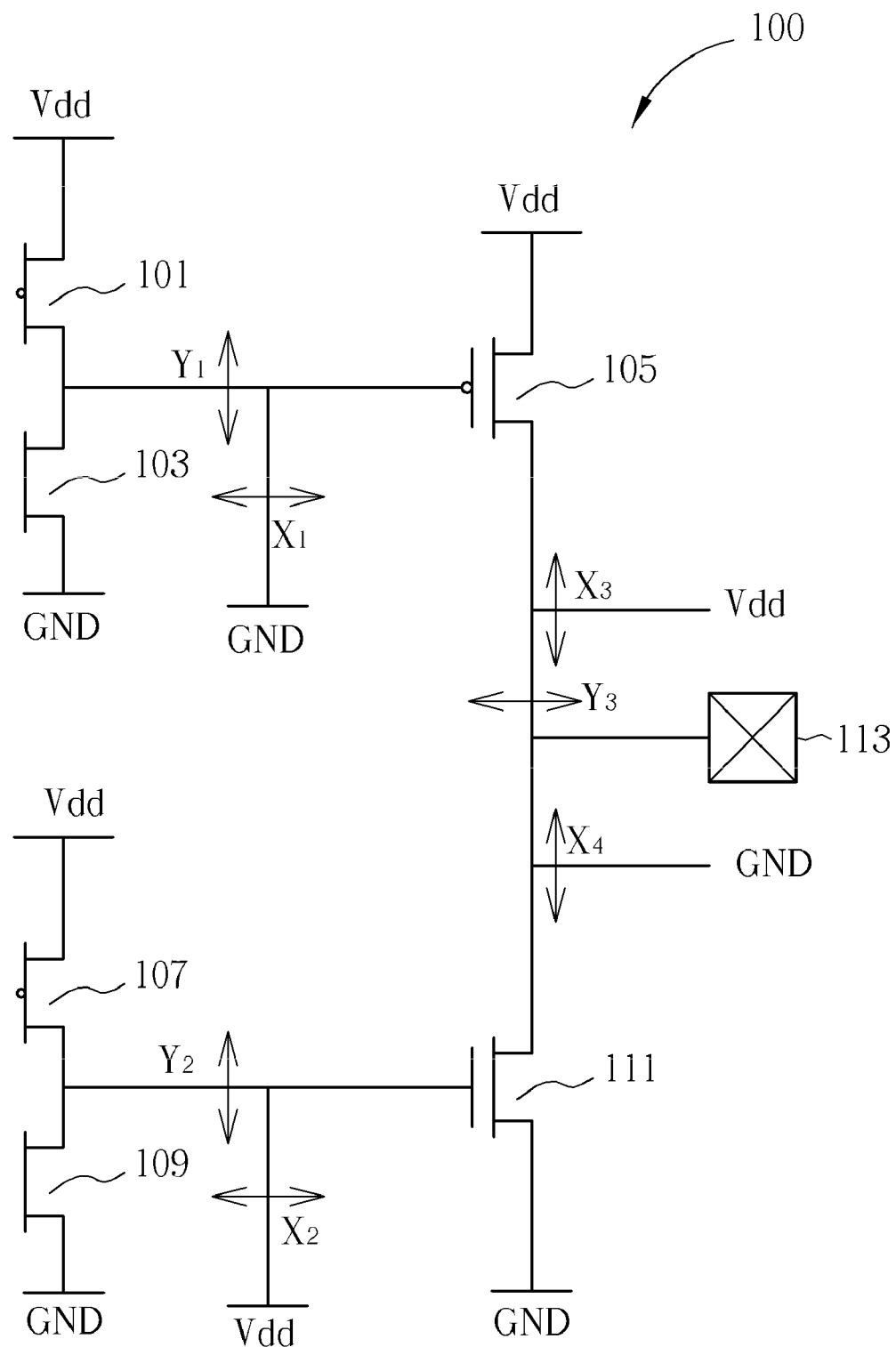
FIG. 1 illustrates a decouple capacitor forming circuit according to a first embodiment of the present invention.

FIG. 1 illustrates a decouple capacitor forming circuit 100 according to a first embodiment of the present invention. As shown in FIG. 1, the decouple capacitor forming circuit 100 is an I/O (input/output) circuit in the integrated circuit, which includes a first predetermined voltage source $V_{dd}$, a second predetermined voltage source GND, PMOS (P type metal oxide semiconductor) transistors 101, 105 and 107, and NMOS transistors 103, 109 and 111. The drain terminal of the PMOS transistor 101 is coupled to the second predetermined voltage GND. The drain terminal of the NMOS transistor 103 is coupled to the second predetermined voltage GND. The source terminal of the PMOS transistor 105 is coupled to a first predetermined voltage $V_{dd}$, the drain terminal thereof is coupled to the first predetermined voltage $V_{dd}$ and the pad 113, and the gate terminal thereof is coupled to the second predetermined voltage GND, the drain terminal of the PMOS transistor 101 and the drain terminal of the NMOS transistor 103.

The drain terminal of the PMOS transistor 107 is coupled to the first predetermined voltage $V_{dd}$. The drain terminal of the NMOS transistor 109 is coupled to the first predetermined voltage $V_{dd}$.

If the structure shown in FIG. 1 is utilized as a normal I/O circuit, the positions $X_1$, $X_2$, $X_3$ and $X_4$ are cut. However, if the structure shown in FIG. 1 is utilized as a decouple capacitor, the positions $Y_1$, $Y_2$, and $Y_3$ are cut, thereby the gate terminal of the PMOS transistor 105 is not coupled to the PMOS transistor 101 and the NMOS transistor 103. Also, via cutting the positions $Y_1$, $Y_2$, $Y_3$ and $Y_4$, the drain terminal of the PMOS transistor 105 is not coupled to the pad 113, and the gate terminal of the NMOS transistor 113 is not coupled to the PMOS transistor 107 and the NMOS transistor 109. In this way, the decouple capacitor is formed.

Figure 2:
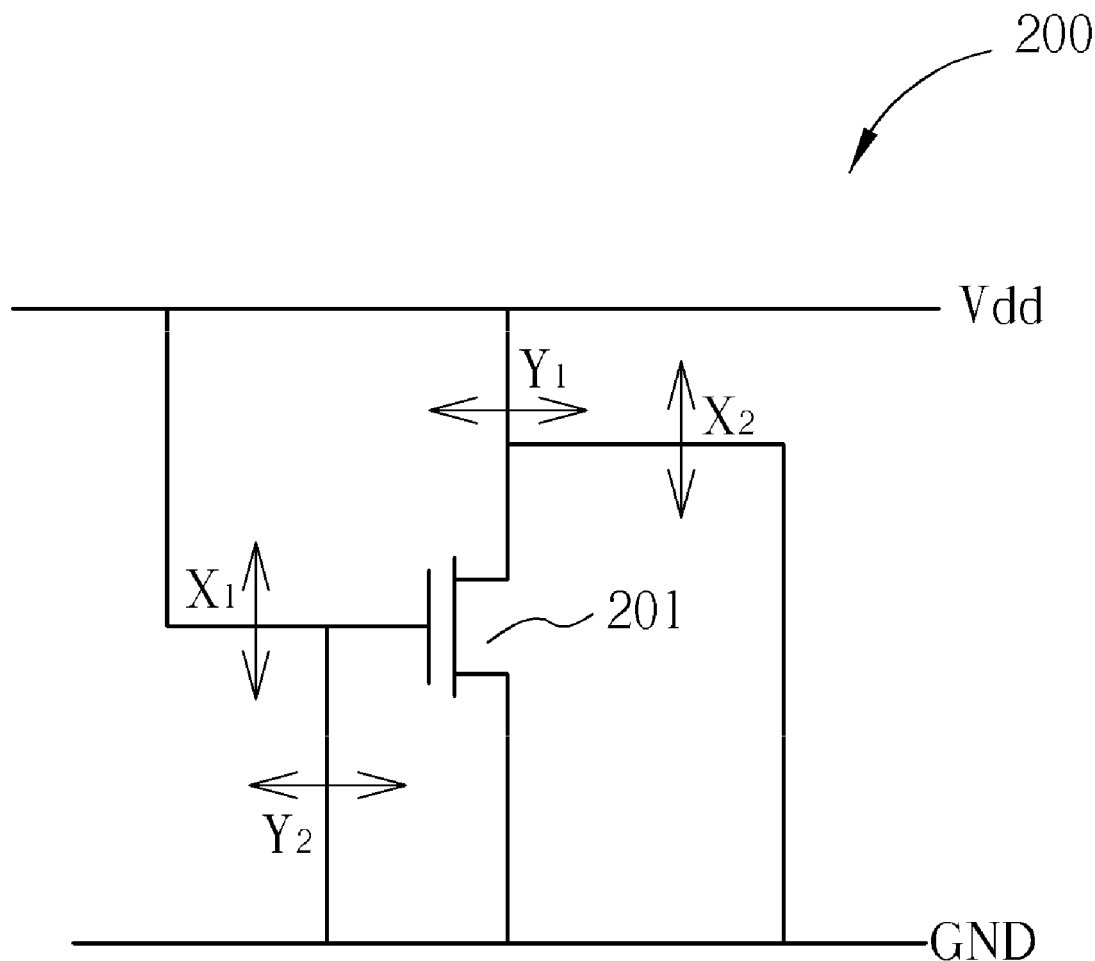
FIG. 2 illustrates a decouple capacitor forming circuit according to a second embodiment of the present invention.

FIG. 2 illustrates a decouple capacitor forming circuit 200 according to a second embodiment of the present invention. The decouple capacitor forming circuit 200 can be part of an I/O circuit and is utilized as an ESD protection circuit. The decouple capacitor forming circuit 200 includes a MOS transistor 201 having a drain terminal coupled to the first predetermined voltage $V_{dd}$, the second predetermined voltage GND and a gate terminal thereof. The gate terminal of the MOS transistor 201 is also coupled to the first predetermined voltage $V_{dd}$ and the second predetermined voltage GND. The source terminal of the MOS transistor 201 is coupled to the second predetermined voltage GND and the gate terminal thereof. If the decouple capacitor forming circuit 200 is utilized as an ESD protection circuit, the positions $X_1$ and $X_2$ are cut, and the positions $Y_1$ and $Y_2$ are cut if the decouple capacitor forming circuit 200 is utilized as a decoupled capacitor. In this way, the drain terminal of the MOS transistor 201 is not coupled to the first predetermined voltage $V_{dd}$ and the gate terminal of the MOS transistor 201, and the gate terminal of the MOS transistor 201 is not coupled to the second predetermined voltage GND. In this embodiment, the MOS transistor 201 is an NMOS transistor but can also be replaced with a PMOS transistor. Please note that the voltage distribution in this case (when the MOS transistor 201 is a PMOS transistor) is different from the above embodiment.

It should be noted that the I/O circuits shown in FIG. 1 and FIG. 2 are only examples and do not mean to limit the scope of the present invention. I/O circuits with other structures can also be utilized for the present invention.

Therefore, the concept of the present invention can be summarized as below: a method for forming a decouple capacitor in an integrated circuit, the integrated circuit including a core circuit and a plurality of I/O circuits coupled to the core circuit. The method comprises: selecting at least one specific I/O circuit from the I/O circuits, and cutting part of the lines of the specific I/O circuit to form decouple capacitors of the integrated circuit. In a preferred embodiment, each of the I/O circuits includes at least one switch device, and lines of at least a specific I/O circuit selected from the I/O circuits are cut such that a control terminal of the switch device in the specific I/O circuit is coupled to a first predetermined voltage, and other terminals of the switch device are coupled to a second predetermined voltage.

The step of cutting part of the lines of the specific I/O circuit can be performed via varying a mask for producing the integrated circuit. Additionally, the step of cutting part of the lines of the specific I/O circuit can be performed after the integrated circuit is generated.

Via the above-mentioned embodiments, an unused I/O circuit can be utilized to form a decouple capacitor of the integrated circuit for decreasing signal noise in the integrated circuit.

Those skilled in the art will readily observe that numerous modifications and alterations of the device and method may be made while retaining the teachings of the invention.

What is claimed is:

1. An integrated circuit, comprising:
   a core circuit; and
   a plurality of I/O circuits, coupled to the core circuit;
   wherein part of a plurality of lines in at least one specific I/O circuit of the I/O circuits are cut to form decouple capacitors of the integrated circuit.

2. The integrated circuit of claim 1, further comprising a plurality of pads respectively coupled to the I/O circuits, wherein some of the pads are bonding while the others of the pads are non-bonding, and the specific I/O circuit is coupled to a non-bonding pad.

3. The integrated circuit of claim 1, wherein each of the I/O circuits comprises at least one switch device, where lines of the specific I/O circuit are cut such that a control terminal of the switch device in the specific I/O circuit is coupled to a first predetermined voltage while the other terminals of the switch device are coupled to a second predetermined voltage.

4. The integrated circuit of claim 3, wherein each of the I/O circuits comprises:
   a first PMOS transistor, having a drain terminal coupled to the second predetermined voltage;
   a first NMOS transistor, having a drain terminal coupled to the second predetermined voltage;
   a second PMOS transistor, having a source terminal coupled to the first predetermined voltage, a drain terminal coupled to the first predetermined voltage and the pad, and a gate terminal coupled to the second predetermined voltage, the drain terminal of the first PMOS transistor and the drain terminal of the first NMOS transistor;
   a third PMOS transistor, having a drain terminal coupled to the first predetermined voltage;
   a second NMOS transistor, having a drain terminal coupled to the first predetermined voltage; and
   a third NMOS transistor, having a drain terminal coupled to the second predetermined voltage and the pad;
   wherein lines of the I/O circuit are cut, such that the gate terminal of the second PMOS transistor is not coupled to the first PMOS transistor and the first NMOS transistor, such that the drain terminal of the second PMOS transistor is not coupled to the pad, and a gate terminal of the third NMOS transistor is not coupled to the third PMOS transistor and the second NMOS transistor, thereby forming the decouple capacitor.

5. The integrated circuit of claim 3, wherein each of the I/O circuits comprises:
   a MOS transistor, having a drain terminal coupled to the first predetermined voltage, the second predetermined voltage and a
      gate terminal of the MOS transistor, wherein the gate terminal of the MOS transistor is also coupled to the first predetermined voltage and the second predetermined voltage, and a source terminal of the MOS transistor is coupled to the second predetermined voltage and the gate terminal;
   wherein lines of the I/O circuit are cut, such that the drain terminal of the MOS transistor is not coupled to the first predetermined voltage and the gate terminal of the MOS transistor, and the gate terminal of the MOS transistor is not coupled to the second predetermined voltage.

6. A decouple capacitor forming circuit, comprising at least one circuit module including:
   a first PMOS transistor, having a drain terminal coupled to a first predetermined voltage;
   a first NMOS transistor, having a drain terminal coupled to the first predetermined voltage;
   a second PMOS transistor, having a source terminal coupled to a second predetermined voltage, a drain terminal coupled to the second predetermined voltage and a pad, and a gate terminal coupled to the first predetermined voltage, the drain terminal of the first PMOS transistor and the drain terminal of the first NMOS transistor;
   a third PMOS transistor, having a drain terminal coupled to the second predetermined voltage;
   a second NMOS transistor, having a drain terminal coupled to the second predetermined voltage; and
   a third NMOS transistor, having a drain terminal coupled to the second predetermined voltage and the pad;
   wherein lines of the I/O circuit are cut, such that the gate terminal of the second PMOS transistor is not coupled to the first PMOS transistor and the first NMOS transistor, such that the drain terminal of the second PMOS transistor is not coupled to the pad and a gate terminal of the third NMOS transistor is not coupled to the third PMOS transistor and the second NMOS transistor, thereby forming the decouple capacitor.

7. A decouple capacitor forming circuit, comprising at least one circuit module including:
  a MOS transistor, having a drain terminal coupled to a first predetermined voltage, a second predetermined voltage and a gate terminal of the MOS transistor, wherein the gate terminal of the MOS transistor is also coupled to the first predetermined voltage and the second predetermined voltage, and a source terminal of the MOS transistor is coupled to the second predetermined voltage and the gate terminal of the MOS transistor;
  wherein lines of the I/O circuit are cut, such that the drain terminal of the MOS transistor is not coupled to the first predetermined voltage and the gate terminal of the MOS transistor, and the gate terminal of the MOS transistor is not coupled to the second predetermined voltage.

8. A method for forming a decouple capacitor in an integrated circuit, the integrated circuit comprising a core circuit and a plurality of I/O circuits coupled to the core circuit, the method comprising:
  selecting at least one specific I/O circuit from the I/O circuits; and
  cutting part of a plurality of lines of the specific I/O circuit to form decouple capacitors of the integrated circuit.

9. The method of claim 8, wherein the step of cutting part of the lines of the specific I/O circuit is performed via varying a mask for producing the integrated circuit.

10. The method of claim 8, wherein the step of cutting part of the lines of the specific I/O circuit is performed after the integrated circuit is generated.

11. The method of claim 8, further comprising:
  coupling respectively a plurality of pads comprised in the integrated circuit to the I/O circuits;
    bonding some of the pads while not bonding the others of the pads; and
  coupling the specific I/O circuit to a non-bonding pad.

12. The method of claim 8, wherein each of the I/O circuits comprises at least one switch device, the method comprising:
  cutting lines of the specific I/O circuit such that a control terminal of the switch device in the specific I/O circuit is coupled to a first predetermined voltage while the other terminals of the switch device are coupled to a second predetermined voltage.

* * * * *